(12) United States Patent
Buda et al.

(10) Patent No.: US 6,460,162 B1
(45) Date of Patent: Oct. 1, 2002

(54) PRODUCT CODE ITERATIVE DECODING

(75) Inventors: Fabien Buda, Paris; Juing Fang, Vincennes, both of (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/446,152

(22) PCT Filed: Apr. 29, 1999

(86) PCT No.: PCT/FR99/01018

§ 371 (c)(1),
(2), (4) Date: Dec. 17, 1999

§ 102(e) Date: Dec. 17, 1999

(87) PCT Pub. No.: WO99/57816

PCT Pub. Date: Nov. 11, 1999

(30) Foreign Application Priority Data

May 4, 1998 (FR) .............................. 98 05612

(51) Int. Cl.[7] .................................................. G06F 11/10
(52) U.S. Cl. ...................................... 714/807; 714/804
(58) Field of Search ................................ 714/792, 795, 714/755, 780, 786, 807, 804

(56) References Cited

U.S. PATENT DOCUMENTS

| | | | | |
|---|---|---|---|---|
| 4,493,082 A | * | 1/1985 | Cumberton et al. | 714/792 |
| 5,539,757 A | * | 7/1996 | Cox et al. | 714/795 |
| 6,122,763 A | * | 9/2000 | Pyndiah et al. | 714/755 |
| 6,161,209 A | * | 12/2000 | Moher | 714/780 |
| 6,192,501 B1 | * | 2/2001 | Hladik et al. | 714/786 |

FOREIGN PATENT DOCUMENTS

EP         0 654 910 A1    5/1995

OTHER PUBLICATIONS

M. Fossorier et al, "Soft–Decision Decoding of Linear Block Codes Based on Ordered Statistics", IEEE Transactions On Information Theory, vol. 41, No. 5, Sep. 1, 1995, pp. 1379–1396, XP000542626.

R. Pyndiah et al, "Near Optimum Decoding of Product Codes", Proceedings of The Global Telecommunications Conference (GLOBECOM), San Francisco, Nov. 28–Dec. 2, 1994, vol, 1, Nov. 28, 1994, pp. 339–343, XP000488569, Institute of Electrical and Electronics Engineers.

D. Chase, "A Class of Algorithms for Decoding Block Codes with Channel Measurement Information", IEEE Transactions on Information Theory, vol. 18, No. 1, Jan. 1, 1972, pp. 170–182, XP000500203.

* cited by examiner

*Primary Examiner*—David Ton
(74) *Attorney, Agent, or Firm*—Sughrue Mion, PLLC

(57) ABSTRACT

A method of soft input to soft output decoding of a word $\underline{s}$ of a block linear code of dimension k and length n received from a transmission channel is provided, including generating a list of firm words ($\underline{u}_b$) of the code close to the received code word ($\underline{s}$) by coding a list of k-tuplets obtained by firmly approximating components of the received word and changing the least likely components, and calculating the $j^{th}$ component of the output soft word as the difference between the metrics of the closest generated code word and the closest generated code word having an opposite $j^{th}$ component, or, failing this, the farthest generated code word. Also provided is a method of iterative decoding of a product code word received on a transmission channel using the soft input to soft output decoding method. It rapidly and efficiently decodes product code words without an algebraic decoder.

14 Claims, 5 Drawing Sheets

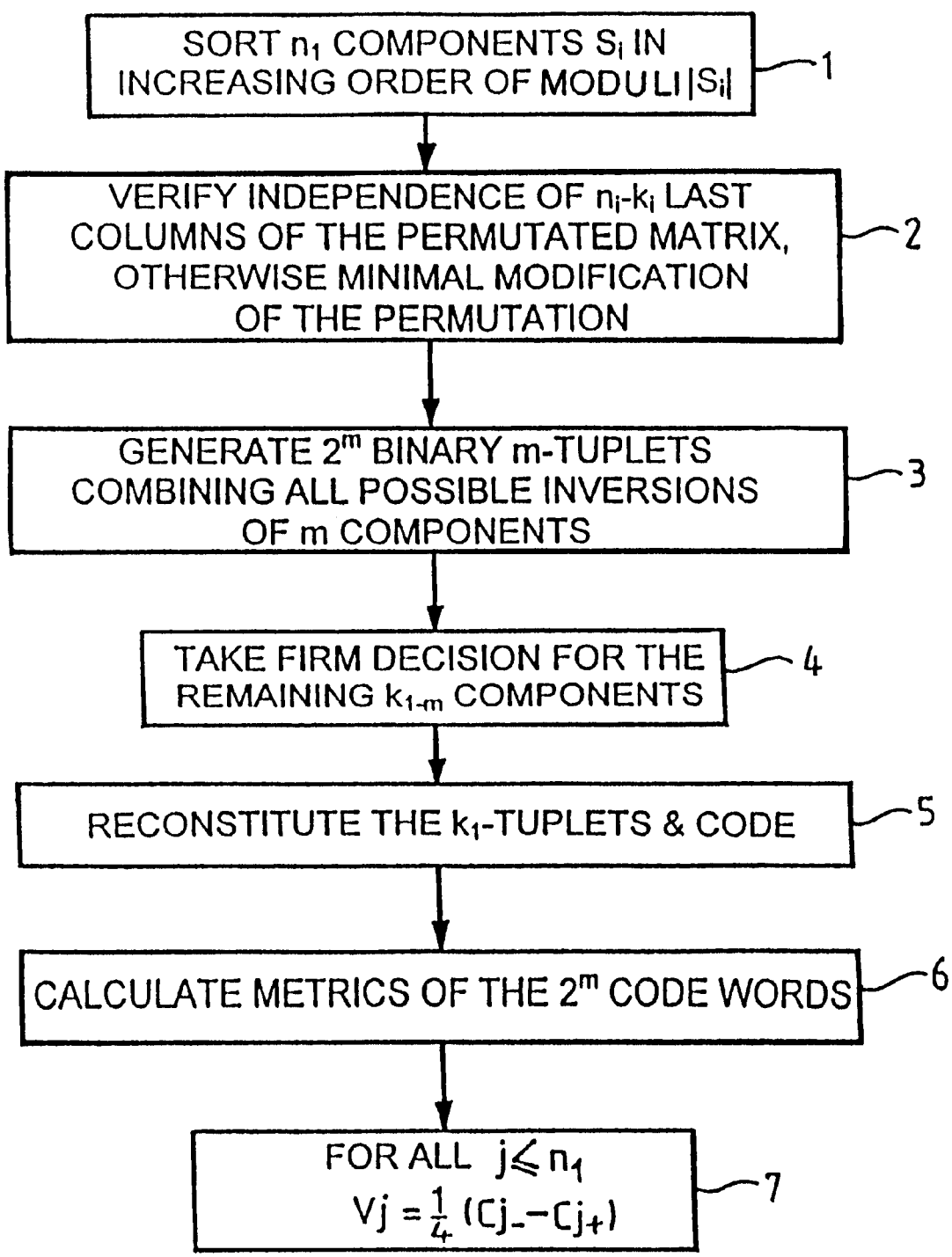
FIG_1

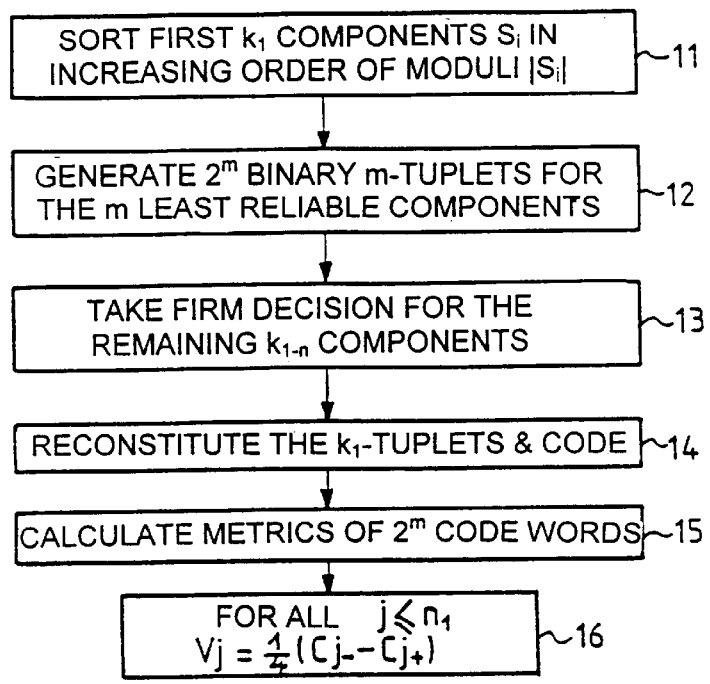
FIG_2
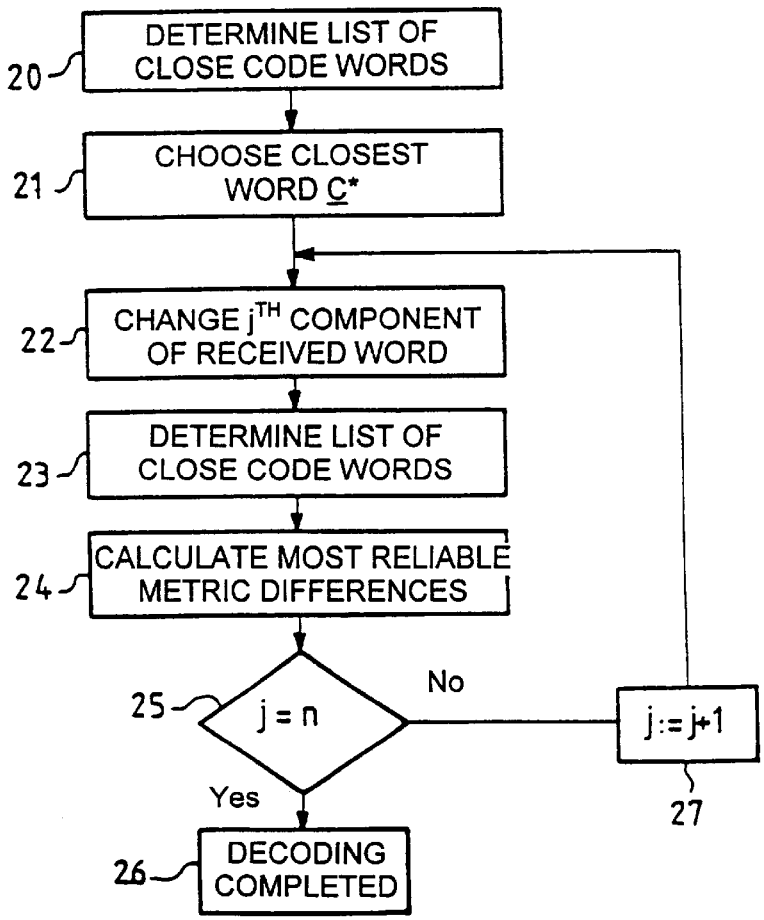
FIG_3

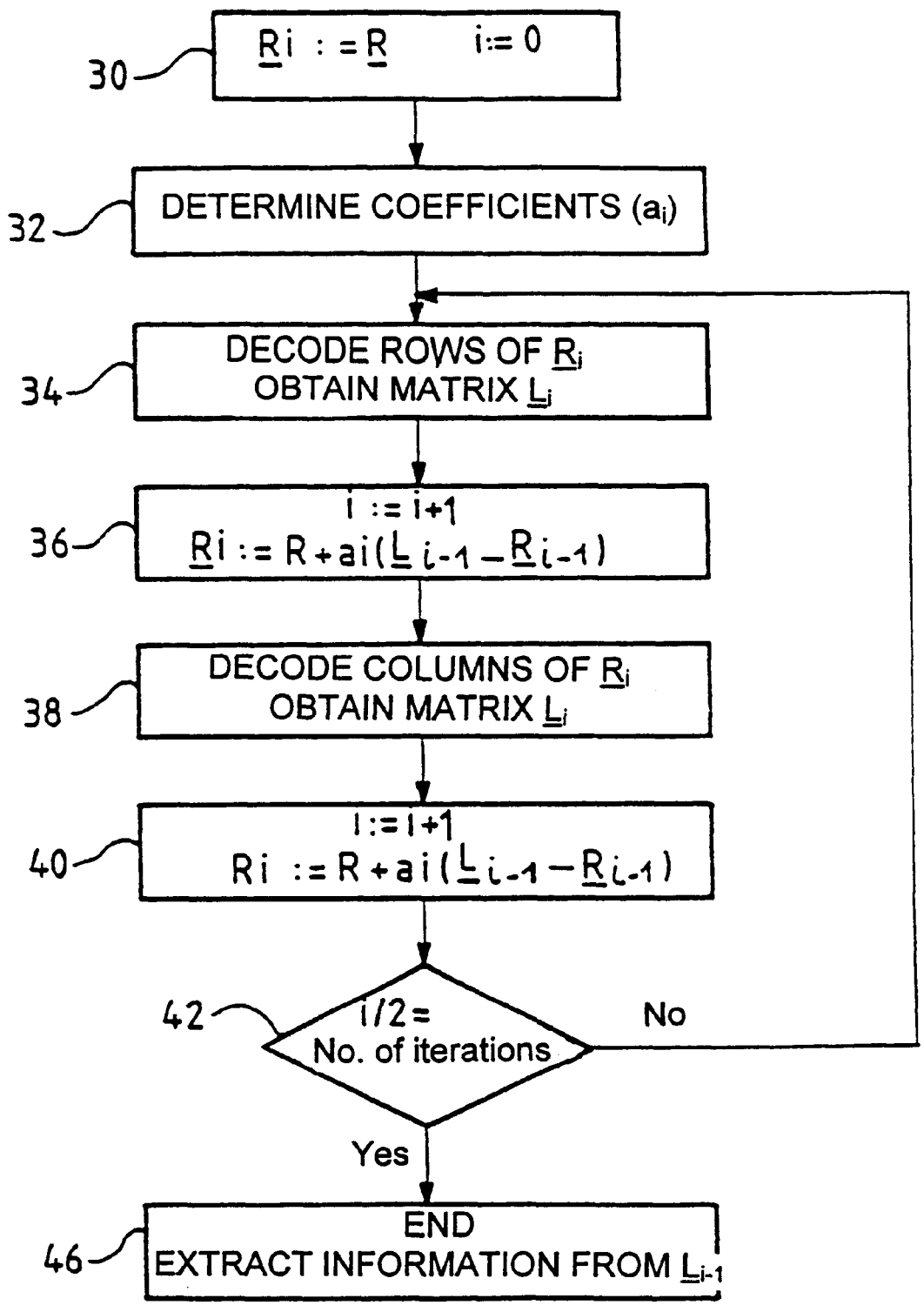

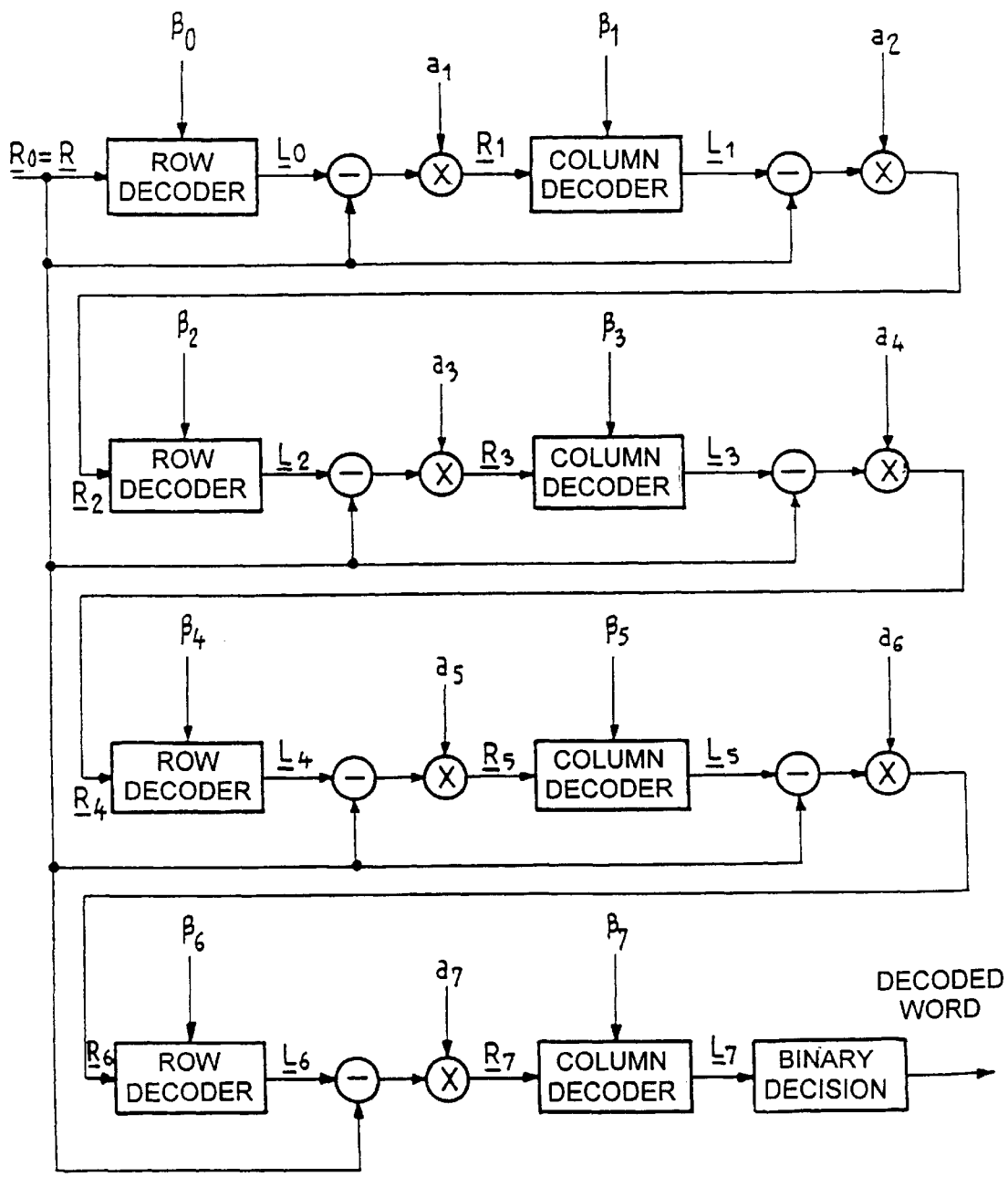
FIG_5

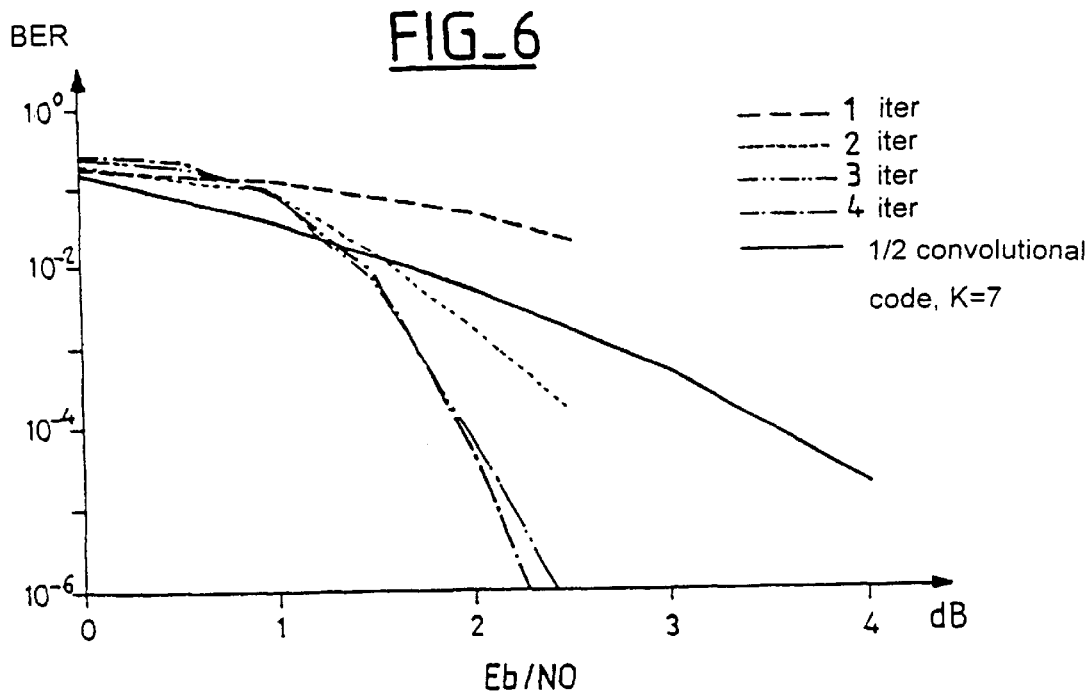
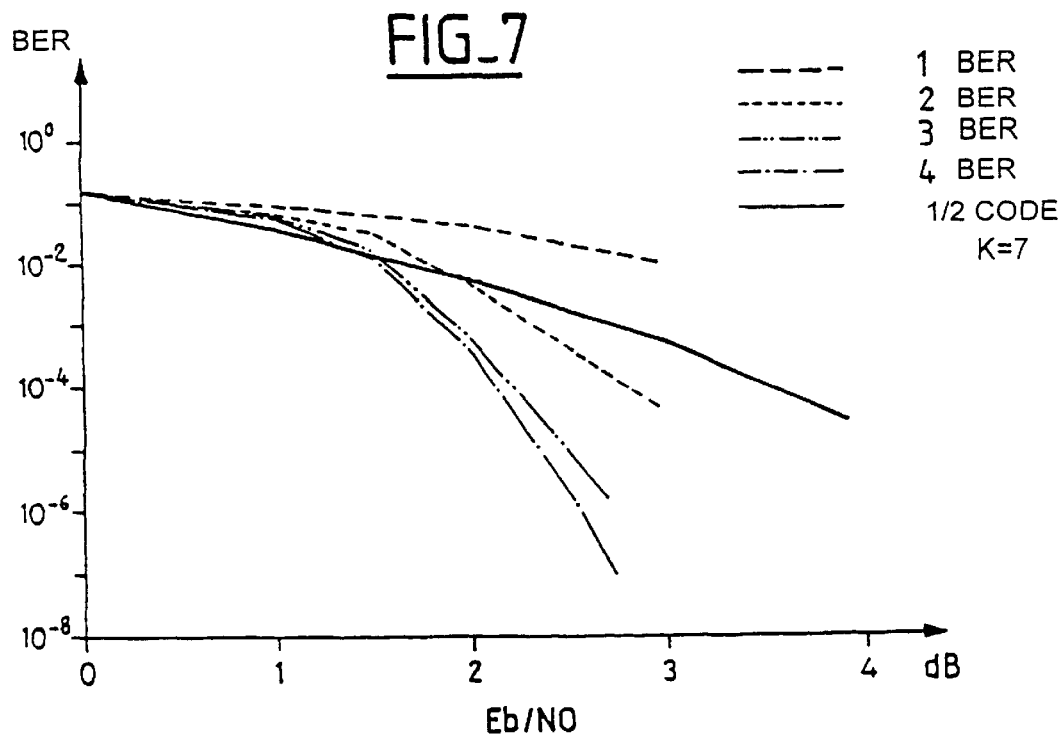

PRODUCT CODE ITERATIVE DECODING

This application is a 371 of PCT/FR99/01018 filed Apr. 29, 1999.

BACKGROUND OF THE INVENTION

The present invention relates to a method of iteratively decoding product codes. The invention also relates to a transmission method and a transmission system using a decoding method of this kind.

The invention relates to decoding product codes of block linear codes. It applies to the field of channel coding for transmission. A typical transmission channel comprises a binary source, a coder, a modulator which transmits on a channel, a demodulator at the output of the channel, and a decoder which supplies the binary signal. The purpose of channel coding is to reduce the power needed to achieve a given bit error rate. French Patent Application No. 97 12594 filed on Oct. 9, 1997, whose title [in translation] is "Product code block coding method applicable in particular to coding an ATM cell", gives a description of the basic concepts of channel coding and transmission, and may be referred to for further details. To the degree that the invention relates to channel decoding, the other elements of the transmission system—such as source coding and modulation to demodulation as a function of the transmission medium—are not explained further.

It is conventional to use redundant codes and product codes for coding. A code $C_1$ is generally characterized by a triplet $(n_1, k_1, d_1)$, where $k_1$ is the number of input bits of the code, $n_1$ is the number of output bits of the code and $d_1$ is the minimum Hamming distance of the code. Applying a code of this kind to a k-tuplet $(x_1, \ldots, x_k)$ supplies an n-tuplet $(x_1, \ldots, x_k, x_{k+1}, \ldots, x_n)$ with n–k redundant bits.

The expression "product code" refers to the successive application of two codes $C_1$ and $C_2$, in the following manner. Consider $k_1.k_2$ bits, in the form of $k_2$ words each of $k_1$ bits. A code $C_1$ $(n_1, k_1, d_1)$ is applied to the $k_2$ words of $k_1$ bits and $k_2$ words of $n_1$ bits are obtained. Stored in matrix form, the $k_2$ words of $n_1$ bits form $n_1$ columns, the $j^{th}$ column being formed of the $j^{th}$ bit of each of $k_2$ words. A code $C_2$ $(n_2, k_2, d_2)$ is applied to each of these $n_1$ columns of $k_2$ bits to obtain $n_1$ words of $n_2$ bits. Applying a product code of the above kind changes from $k_1.k_2$ bits to $n_1.n_2$ bits, with $n_1.n_2-k_1.k_2$ redundant bits. If the codes are linear, this produces $n_2$ rows of words of code $C_1$ or $n_1$ columns of words of code $C_2$. The product code is a code having the parameters $(n_1.n_2, k_1.k_2, d_1.d_2)$. The encoding order is immaterial, and the same results are obtained by coding the rows first, as described above, or by coding the columns first. Product codes of the above kind are described in the literature on channel coding. The French application referred to above and FIG. 2 of FR-A-2 712 760 explain in detail the principle of coding by means of a product code of the above kind.

The problem with product codes of the above kind is decoding at the demodulator output. Sets of values of bits (generally modulated in the form ±1) are obtained at the output of the demodulator, accompanied by noise. The value received, accompanied by noise, which is a real value, is referred to as a "soft" value. The value ±1, i.e. the corresponding binary value, obtained for a threshold-based decision on the value received is referred to as a "firm" value. Hereinafter the expression "firm word" means a binary word and the expression "soft word" means a word actually received, formed of real values.

On transmission with coding by a product code, a set $\underline{R}=\{r_{i,j}\}$ of $n_1.n_2$ real values (soft values) is obtained at the output of the demodulator. Decoding consists in determining the word of the product code $C_1.C_2$ to which the soft values correspond, according to some particular performance criterion. If the noise is additive Gaussian white noise, the optimum solution is to look for the product code word which minimizes the euclidean distance to the received soft word $\underline{R}$. This criterion of the maximum likelihood is impossible in practice, once the product $k_1.k_2$ routinely exceeds a few hundred.

Various solutions have therefore been proposed to the problem of decoding product codes. The most immediate solution consists in taking firm decisions on each bit of the received soft word and successively decoding the rows and then the columns, as firm decisions, by applying a decoder of the code $C_2$ to the columns and then a decoder of the code $C_1$ to the rows. This solution is a long way short of the optimum and cannot achieve the theoretical gain of a product code because it does not use all the information received from the transmission channel.

FR-A-2 712 760 proposes an algorithm for iterative decoding of product codes $C_1.C_2$ in which the columns or rows of the matrix formed from the received product code word are decoded iteratively and successively. For each column or row, i.e. for each word of the code $C_2$ or $C_1$ received accompanied by noise (received soft word), the above document proposes to use a modified Chase algorithm for decoding, to be more precise:

generating a set of firm words of the code $C_2$ or $C_1$ a priori close to the received soft word in the corresponding row or column, calculating the Euclidean distance between the various firm words and the received soft word, and choosing as the received code word whichever of the various firm words is at the minimum distance from the soft word actually received.

To generate the set of firm words of the code $C_2$ (or $C_1$) a priori close to the received soft word, the above document proposes:

to mark the least reliable $\underline{p}$ components of the soft word received, to construct $\underline{q}$ test binary sequences from the $\underline{p}$ least reliable components, to construct $\underline{q}$ binary words to be decoded from the above sequences of binary tests and a current binary value of the decoded word, which current binary value is initialized at the outset by a binary approximation of each of the received bits, and to decode the $\underline{q}$ binary words with a Berkelamp decoder (algebraic decoder) to obtain q' code words, and if necessary to verify that the q' words obtained are words of the code $C_2$ (or $C_1$).

The construction of the a binary words and their decoding by the above algorithm is inefficient: the $\underline{q}$ words generated are words of the code $C_2$ (or $C_1$), but are not necessarily different. There is obtained at the output of the decoder a number q' of different code words which is less than the number $\underline{q}$ of words generated.

Also, the above method works only with codes for which there exists an algebraic decoder. Implementing algebraic decoders necessitates calculations in the Gallois body and a complex architecture.

A doctoral thesis submitted to the Paris ENST by Juing Fang in 1986, whose title [in translation] is "Weighted decoding of block linear codes", describes a soft input algorithm for decoding a block linear code. The algorithm is optimum in the maximum likelihood sense and does not explicitly use the algebraic structure of the code. It supplies at the output a firm code word with maximum likelihood. The algorithm is one of many soft input to firm output decoding algorithms and there is no suggestion of using lists to generate a soft output.

SUMMARY OF THE INVENTION

The invention proposes a solution to the problem of iterative decoding of product codes which enables faster and more efficient decoding and which applies to all types of code, not only those for which there is an algebraic decoder.

Decoding product codes is not a mathematical problem, but rather a serious technical problem in the transmission field. It is applied directly to decoding values of received product code words or bits at the output of the demodulator of a transmission channel.

To be more precise, the invention proposes a method of soft input to soft output decoding of a word ($\underline{s}$) of a block linear code of dimension $\underline{k}$ and length $\underline{n}$, received from a transmission channel, comprising the steps of:

generating a list of firm words ($\underline{u}_b$) of the code close to the received code word ($\underline{s}$) by coding a list of the most likely seeming k-tuplets, and calculating the $j^{th}$ component of the output soft word as the difference between the metrics of the closest generated code word and the closest generated code word having an opposite $j^{th}$ component.

In one embodiment of the invention, the most likely k-tuplets are obtained by firm approximation of the components of the received word and by changing the least reliable components.

Each k-tuplet from the list of k-tuplets is advantageously obtained by:

listing the components of the received code word in order of reliability with a permutation (T), verifying that the $\underline{k}$ most reliable components of the word obtained in this way can generate the other n–k components, choosing firm values for the least reliable $\underline{m}$ components from said $\underline{k}$ components, where $\underline{m}$ is an integer less than $\underline{k}$, firmly approximating the other k–m components, and coding the firm word obtained in this way by a code equal to the composition of said code by the inverse of said permutation.

The verification can also be effected by:

applying the code of the permutation to the columns of the parity matrix, and verifying the rank of the matrix formed of the last n–k columns of the permutated parity matrix.

The verification step, when negative, is followed by a step of modifying the permutation.

In another embodiment of the invention each k-tuplet from the list of k-tuplets is obtained by:

listing the first $\underline{k}$ components of the received code word in order of reliability with a permutation (T), choosing firm values for the least reliable $\underline{m}$ components, where $\underline{m}$ is an integer less than $\underline{k}$, firmly approximating the other k–m components, and coding the firm word obtained in this way by a code equal to the composition of said code by the inverse of said permutation.

If there is no closest generated code word having an opposite $j^{th}$ component, the $j^{th}$ component of the output soft word is preferably calculated as the difference between the metric of the closest generated code word and the farthest generated code word.

If there is no closest generated code word having an opposite $j^{th}$ component, the $j^{th}$ component of the output soft word can also be calculated by adding to the $j^{th}$ component of the received word a coefficient assigned the sign of the firm decision of the $j^{th}$ component of the closest code word received.

The received word is advantageously affected by additive Gaussian white noise.

The invention also consists in a method of soft input to soft output decoding a word ($\underline{s}$) of a block linear code of dimension $\underline{k}$ and length $\underline{n}$ received from a transmission channel, comprising the steps of:

choosing the code word closest the received word in a list of firm words ($\underline{u}_b$) of the code close to the received code word ($\underline{s}$) generated by coding a list of the least likely k-tuplets, for each $j^{th}$ component of the received word, $\underline{j}$ varying from 1 to $\underline{n}$:

replacing the $j^{th}$ component of the received word by the inverse of the $j^{th}$ component of said nearest code word, choosing the code word nearest the word obtained in the replacement step in a list of firm words of the code close to the code word obtained in the replacement step, generated by coding a list of the most likely k-tuplets, calculating the $j^{th}$ component of the output soft word as the difference between the metric of the code word nearest the received word and the code word nearest the word obtained in the replacement step.

In one embodiment of the invention the step of choosing the code word closest to the received word the most likely k-tuplets are obtained by firmly approximating the most reliable components of the received word and changing the least reliable components.

In the step of choosing the code word closest to the word obtained in the replacement step the most likely k-tuplets are preferably obtained by firmly approximating the most reliable components of the word obtained in the replacement step and changing the least reliable components.

In one embodiment of the invention the received word is affected by additive Gaussian white noise.

The invention also consists in a method of iterative decoding a word ($\underline{R}$) of a product code received from a transmission channel, comprising for at least one iteration soft input to soft output decoding of rows or columns of said product code word using a method of the above kind.

BRIEF DESCRIPTION OF THE INVENTION

Other features and advantages of the invention will become apparent on reading the following description of embodiments of the invention which is given by way of example and with reference to the accompanying drawings, in which:

FIG. 1 is a flowchart of a first embodiment of a soft input to soft output decoding method used in the invention, FIG. 2 is a flowchart of a second embodiment of a soft input to soft output decoding method used in the invention, FIG. 3 is a flowchart of a third embodiment of a soft input to soft output decoding method used in the invention, FIG. 4 is a flowchart of an iterative decoding algorithm of the invention, FIG. 5 is a flowchart of the decoder of the invention for four iterations, and FIGS. 6 and 7 are graphical representations of the results of the method of the invention.

DETAILED DESCRIPTION OF THE INVENTION

The invention proposes to use encoding instead of decoding to determine a set of code words which are a priori close to the soft code word received in a soft input to soft output decoding algorithm.

FIG. 1 is a flowchart of a first embodiment of a soft input to soft output decoding method used in the invention, FIG. 1 shows the steps needed for soft output decoding of a received soft line in a row or a column of the received product code word.

In the remainder of the description, the notation $\underline{R}=\{r_{i,j}\}$ denotes the product code soft word received from the transmission channel, $1 \leq i \leq n_1$, $1 \leq j \leq n_2$. The soft word corresponds to transmission over the channel of a firm or binary word of the product code $C_2.C_1$ which reaches the decoder affected by noise. A representation of soft values in the set of real numbers is considered, the firm values corresponding to ±1. In a representation of this kind, the modulus of the received soft value is indicative of the reliability of the value and its sign gives the received firm value.

The decoding of one row of the code word is described with reference to FIG. 1 and the same method is applied mutatis mutandis to decoding the columns of the product code word. Consider, therefore, the soft word corresponding to a given row $\underline{s}=\{s_i, 1 \leq i \leq n_j\}$, with $s_i=r_{i,j}$, for a given value of j. This word is a version with errors of a word of the code $C_1$ $(n_1, k_1, d_1)$. The word contains $k_1$ bits supplied by the source coder and $n_1-k_1$ redundant bits generated by the code $C_1$. To simplify the explanation, the systematic form of the code is considered, in which the $k_1$ input components are found identically in the output code word.

In a first step 1, the set of received components $s_i$ is sorted in increasing order of the moduli $|s_i|$, i.e. in accordance with their reliability. The corresponding permutation is denoted T.

A second step 2 verifies that the last $k_1$ components of the image $T(s_i)$ of $s_i$ in the permutation enable recovery of the remaining $n_1-k_1$. This can be done by applying the permutation T to the columns of the parity matrix of the code $C_1$ and verifying that the last $n_1-k_1$ columns of the permutated matrix obtained are independent. If they are not, the permutation T is modified to obtain $n_1-k_1$ independent last columns when the permutation is applied to the columns of the parity matrix. This can be done by changing the $j^{th}$ column, with $j \leq [n_1-k_1+1, n_1]$, i.e. by composing T with a permutation $(p, n_1-k_1+j)$, where $\underline{p}$ is an integer less than or equal to $k_1$. In the remainder of the method, up to step 8, the permutated code words are operated on this permutated space.

A third step 3 considers $\underline{m}$ ($m<k_1$) of the last $k_1$ components of the permutated received word, for example the $\underline{m}$ least reliable components, and corresponding m-tuplets are created by allocating them binary values. $2^m$ binary m-tuplets can be generated in this fashion, but it may be more beneficial to generate only certain of the $2^m$ m-tuplets, for example those with the smallest metric.

A fourth step 4 considers the remaining $k_1-m$ components from the last $k_1$ components. A firm decision is taken for each of those components, i.e. a binary or firm value is assigned to each soft component. For example, each component can simply be allocated its sign.

The fifth step 5 reconstitutes from the results of the third and fourth steps a set of binary words $\underline{t}_b=\{t_i, 1 \leq i \leq k_1\}_b$, with $b \leq 2^m$. In other words, each word obtained in step 5 is an assembly or a concatenation of the $\underline{m}$ components created in step 3 and the $k_1-m$ components obtained in step 4. The coding which corresponds to the code $C_1$ in the permutated word space is applied to them.

One method of performing the coding is to use the parity matrix H of the code $C_1$. The permutation T associated with the sorting of the components is applied to the parity matrix H of the code. A Gauss reduction is then applied to the $(n_1-k_1)$ columns farthest to the right in the matrix H permutated by the list T in order to render it into the systematic form. Note that the last $(n_1-k_1)$ columns of the permutated matrix H are generally not independent. In this case, the permutation T can be modified to make the columns independent so that the permutated matrix H can be rendered systematic in this way. The verification proposed in step 2 can be done at the same time as the permutated matrix is rendered systematic. The parity matrix that has been rendered systematic is then advantageously used for encoding in the permutated space.

Permutated firm words $\underline{u}_b=\{u_i, 1 \leq i \leq n_1\}_b$ of the corresponding code are obtained directly in this way, and a priori are close to the permutated version of the word that was sent over the transmission channel.

The sixth step 6 can then calculate the Euclidean distance to the received soft code word si for each of the code words $\underline{u}_b$ obtained. This step can retain only the most reliable code words, their reliability being assessed simply by considering the Euclidean distance just calculated. The threshold used to retain code words, or the number of code words concerned, depends on the total number of code words that have been generated in preceding steps. In other words, the more code words are generated, the greater the number of code words that can be retained. The number of code words retained is a compromise between the complexity caused by generating a large number of code words and the advantage that the probability of finding very reliable code words increases as the total number of code words generated increases.

Soft decoding is done in step 7 in the following manner. For a given received component $s_j$ of given rank j, the closest code word $\underline{u}_j^+$ in the set of code words $\underline{u}_b$ obtained having as the $j^{th}$ component a bit at 1 and the closest code word $\underline{u}_j^-$ having as the $j^{th}$ component a bit at −1 are considered. The value of the $j^{th}$ component of the decoded soft word is then calculated as the difference, multiplied by a normalization factor of one quarter, between the metric $c_{j+}=|\underline{u}_j^--s|$ of the nearest code word $\underline{u}_j^-$ having a bit at −1 in the $j^{th}$ position and the metric $c_{j+}=|\underline{u}_j^+-s|$ of the nearest code word $\underline{u}_j^+$ having a bit +1 in the $j^{th}$ position. In other words, for each value of j, the $j^{th}$ component $v_i$ $\{v_i, 1 \leq i \leq n_1\}$ of the soft code word supplied by the decoder is calculated from $$v_j=(c_{j-}-c_{j+})/4$$

Depending on the number of words generated in step 5 and retained in step 6, there may not be in the set of code words generated two code words having bits of opposite sign in the $j^{th}$ position. This can be the case if the $j^{th}$ component is received with a high reliability. It can also be the case if a small number of code words has been generated or retained. The soft value of the $j^{th}$ component can then be taken as the difference between the weakest metric—that of the word from the list nearest the received code word—and the strongest metric—that of the word from the list farthest from the received code word. In this case, a precise value is found in one of the two metrics and the other metric is approximate or at least its lower limit is considered, taking the metric of the word from the farthest code list.

In this case, the soft value of the $j^{th}$ component could be taken as the sum of $j^{th}$ component of the received word and a factor $\underline{b}$, assigned the sign of the firm decision of the $j^{th}$ component of the nearest code word. In other words, the factor $\underline{b}$ is added if the $j^{th}$ component of the nearest code word is positive, and $-b$ is added if the $j^{th}$ component of the nearest code word is negative. The value of this factor can vary as a function of the iteration.

The space of received words can then be re-entered by applying a permutation which is the inverse of that of step 2. The code word nearest the received word is then found, plus all the reliability coefficients of each symbol, i.e. a weighted output.

The step 7 calculation will now be explained. Consider additive Gaussian white noise $\underline{b}$ whose component $b_i$ are zero on average and have the same variance $s^2$. Thus $$\underline{s} = \underline{e} + \underline{b}$$

where $\underline{s}$ is the received word, as explained above, $\underline{e} = (e_i, 1 \leq i \leq n_1)$ is the code word transmitted with $e_i = \pm 1$, and $\underline{b} = (b_i, 1 \leq i \leq n_1)$. In this case, the reliability measurement associated with each symbol $c_i$ of the decoded word can be determined from the logarithm of the likelihood ratio defined by the equation $$L(c_i) = \log[Pr(c_i=1/\underline{s})/Pr(c_i=-1/\underline{s})]$$

In this case, using Bayes' rule and allowing for the fact that the noise is Gaussian white noise, it can be shown that the likelihood ratio associated with the symbol $c_i$ is equal to:

$$L(c_i) = \log \frac{\sum_{u^+ \in S_{1,j}} \exp\left[-\frac{1}{2\sigma^2} M(s, u^+)\right]}{\sum_{u^- \in S_{-1,j}} \exp\left[-\frac{1}{2\sigma^2} M(s, u^-)\right]}$$

where $S_{1,j}$ and $S_{-1,j}$ are the two sets of words of the code whose $j^{th}$ symbol has the respective value $+1$ or $-1$, $M(\underline{s}, \underline{u})$ is the metric between the code word $\underline{u}$ found by the algorithm and the received word $\underline{s}$, which in this instance is the Euclidean distance between the received word $\underline{s}$ and a word $\underline{u}$ of the code, which distance can be of finite precision. This metric can if necessary be adapted to the situation of channels subject to fading.

Because the number of code words is generally high, calculating the likelihood ratio is relatively complex. If the signal to noise ratio is sufficiently large, the expression can be simplified by retaining only the strongest term in the numerator and in the denominator, in which case the expression for the likelihood ratio logarithm becomes:

$$L(c_i) \approx \log \frac{\underset{u^+ \in S_{1,j}}{\text{Max}} \exp\left[-\frac{1}{2\sigma^2} M(s, u^+)\right]}{\underset{u^- \in S_{-1,j}}{\text{Max}} \exp\left[-\frac{1}{2\sigma^2} M(s, u^-)\right]}$$

$$= \frac{1}{2\sigma^2}\left(\underset{u^- \in S_{-1,j}}{\text{Max}} M(s, u^-) - \underset{u^+ \in S_{-1,j}}{\text{Max}} M(s, u^+)\right)$$

Normalizing the likelihood ratio logarithm by the factor $\sigma^2/2$, the weighted output of the $j^{th}$ symbol $V_j$ is then expressed in the following manner:

$$V_j = \frac{1}{4}\left(\underset{u^- \in S_{-1,j}}{\text{Max}} M(s, u^-) - \underset{u^+ \in S_{-1,j}}{\text{Max}} M(s, u^+)\right)$$

Where $S_{i,j}$ represents the set of words of the code having a symbol equal to $\underline{i}$ ($i=\pm 1$) at position $\underline{j}$. Using the same notation as before for $c_{j-}$ and $c_{j+}$, the expression for step 7 from FIG. 1 is obtained:

$$V_j = \frac{1}{4}(C_{j-} - C_{J+})$$

The steps described with reference to FIG. 1 are used to generate code words which are close to the soft word received on the transmission channel. The method of FIG. 1, by finding a list of words of the code, enables a soft value of each component of the received code word to be deduced therefrom. The complexity of the process depends on the number of code words generated in step 4, in other words on the number of close code words generated. The higher that number, the better the performance of the process but the more complex its implementation, and the lower that number, the better the performance of the process and the lower its efficiency. The chosen number of code words determines the performance to complexity trade-off of the process and is adapted to suit the applicable circumstances. In practice, satisfactory results are obtained for a BCH(31, 21) code extended by retaining the best 19 code words from 50 generated words.

In a variant of step 2, instead of changing the least reliable components, the components which are the least reliable in combination are changed: thus, considering for example the following components, with the corresponding moduli:

| $I_1$ | $I_2$ | $I_3$ | $I_4$ | $I_5$ | $I_6$ |
|---|---|---|---|---|---|
| 0.1 | 0.2 | 0.3 | 0.35 | 0.4 | 0.45 |

$I_2$, then $I_2$, then $I_3$, then $I_1$ and $I_2$, then $I_4$, then $I_1$ and $I_3$, then $I_5$, and so on would be changed, for example. In this way the most reliable components are preserved.

FIG. 2 is a flowchart of a second embodiment of a soft input and soft output decoding method used in the invention. Again, FIG. 2 considers only the example of one row. Again, the invention is described with reference to the systematic form of the code. The soft word corresponding to a given line $\{s_i, 1 \leq i \leq n_1\}$, with $s_i = r_{i,j}$, for a given $j$, is considered. This word is a version subject to errors of a word of the code $C_1(n_1, k_1, d_1)$. The word contains $k_1$ bits supplied by the source coder and $n_1 - k_1$ redundant bits generated by the code $C_1$.

In a first step 11, $k_i$ first components $s_i$ are sorted in increasing order of the moduli $|s_i|$, i.e. in accordance with their reliability. The corresponding permutation is denoted T.

A second step 12 is as in the Chase algorithm, and firm vectors are created for the $\underline{m}$, $m < k_1$ least reliable components. $2^m$ m-tuplets can be generated in this fashion, but it may be more beneficial to generate only certain of the $2^m$ m-tuplets, for example those which have the smallest Euclidean metric. In the situation $k_1 = 4$ and $m = 2$ and the vectors generated are 00, 10, 01, 11, for example.

A third step 13 considers the remaining $k_1 - m$ components and a firm decision is taken for each of those components, i.e. a binary or firm value is assigned to each soft component.

The value sign($s_i$) can simply be assigned to the $i^{th}$ component $s_i$, for example.

Step 14 uses the results of steps 12 and 13 to reconstitute a set of binary words $\underline{t}_b=\{t_i, 1 \leq i \leq k_1\}_b$, with $b \leq 2^m$, by concatenating $\underline{m}$ components obtained in step 12 and $k_1-m$ components obtained in step 13. The code $C1.T^{-1}$ is applied to these firm words, where $T^{-1}$ is the inverse of the permutation T from step 1. Firm words $\underline{u}_b=\{u_i, 1 \leq i \leq n_1\}_b$ of the code $C_1$ are obtained directly in this way, which a priori are close to the word that was sent over the transmission channel.

Step 15 can then calculate for each of the code words $\underline{u}_b$ obtained the Euclidean distance to the received soft code word $s_i$ or the metric of each code word $\underline{u}_b$ relative to the received code word $\underline{s}$. This step can retain from these code words only the most reliable ones, as explained above with reference to step 6 in FIG. 1.

Step 16 is a soft decoding step, like step 7 in FIG. 1.

Compared to the process of FIG. 1, that of FIG. 2 avoids the step of verifying the independence of the last columns of the parity matrix. Compared to the FIG. 1 process, it has the drawback that it does not modify components except from among the first $k_1$ components, rather than from among all of the components of the code word. In other words, the FIG. 1 process can be used to modify components of low reliability which are chosen not only from among the information sent but also from among the redundant values. This changes the least reliable components from among the $k_1$ most reliable components of the code word as a whole, and not only from among the first $k_1$ components of the word sent.

FIG. 3 is a flowchart of a third embodiment of a soft input to soft output decoding method used in the invention. This embodiment begins with the same first five steps as FIG. 1, to obtain a list of code words and their metrics. This is symbolized by step 20 in FIG. 3. Step 21 considers the closest code word $\underline{c}^*$, i.e. the one having the smallest metric, and a current value $\underline{j}$ is initialized to 1.

Step 22 changes the value of $j^{th}$ component $s_j$ of the code word $\underline{s}$ received, to give it a value opposite that of the $j^{th}$ component of the code word $\underline{c}^*$ determined in step 21, with a very high reliability.

As in the first five steps of FIG. 1, step 23 searches a list of code words close to the received word with its $j^{th}$ component modified and calculates their metric.

Step 24 considers the code word $\underline{c}'^*$ having the smallest metric. The $j^{th}$ component of $\underline{c}'^*$ is opposite that of the code word $\underline{c}^*$ determined in step 21. The $j^{th}$ component $v_j$ of the soft output word $\underline{v}$ is then calculated as the difference between the metrics of the words $\underline{c}^*$ and $\underline{c}'^*$ of steps 21 and 24, multiplied by the normalization factor 1/4.

Step 25 compares $\underline{j}$ and $\underline{n}$. If $j=n$, decoding is finished, step 26. Otherwise, in step 27, $\underline{j}$ is incremented by 1 and step 22 is repeated.

Compared to the processes of FIGS. 1 and 2, the process of FIG. 3 gives better results in that two code words having opposite bit values for that component are necessarily obtained for each component. However, this process is more complex, in that the lists of close words must be calculated $n_1+1$ times, rather than only once.

The processes of FIGS. 1 to 3 therefore supply a soft output for each row or each column of the product code word received from the transmission channel. The decoding method of the invention uses this soft decoding method for iterative decoding, as explained with reference to FIG. 4, which shows one implementation of this kind of iterative decoding. An iteration uses the method from one of FIGS. 1 to 3 is used or a combination of those methods to obtain rows and columns for the next iteration from the rows and columns of the current matrix.

A first step 30 initializes a current matrix $\underline{R}_i$ to the value received from the channel $\underline{R}$ the value of $\underline{i}$ being initialized to 0. The next step is step 32.

Step 32 determines coefficients $a_i$ for each value of $\underline{i}$. The coefficients in question form an increasing series of real numbers ($a_i$). Values of these coefficients are given by way of example for an extended BCH(31,21) product code with reference to FIG. 6.

The next step is step 34.

A first step of decoding the rows of the matrix $\underline{R}_i$ using one or other of the soft input to soft output decoding algorithms from FIGS. 1 to 3 determines a new matrix $\underline{L}_i$ each row of which is a word of the code $C_1$. The next step is step 36.

Step 36 increments $\underline{i}$ by 1. Extrinsic information equal to ($\underline{L}_{i-1}-\underline{R}_{i-1}$) extracted from the matrix $\underline{L}_{i-1}$ is weighted by the factor $a_i$ and added to the received matrix $\underline{R}$. A new matrix $\underline{R}_i=\underline{R}+a_i(\underline{L}_{i-1}-\underline{R}_{i-1})$ is calculated before proceeding to step 38.

Step 38 decodes the columns of the matrix $\underline{R}_i$ using one or other of the soft input to soft output decoding algorithms from FIGS. 1 to 3. This produces a matrix $\underline{L}_i$, each row of which is a word of the code $C_2$. Step 38 corresponds, for the columns, to step 34. The next step is step 40.

Step 40 corresponds to step 36. It increments $\underline{i}$ by 1 and forms a new matrix $\underline{R}_i=\underline{R}+a_i(\underline{L}_{i-1}-\underline{R}_{i-1})$.

Step 42 compares the number of iterations, which is equal to $i/2$, to the required number of iterations. Note that the term "iteration" refers to the combination of decoding rows and decoding columns. If further iteration is required, the next step is step 34. Otherwise the next step is step 46.

Step 46 takes binary decisions on the matrix $\underline{L}_{i-1}$ obtained by decoding columns in step 38. It is assumed that the matrix obtained in this way corresponds to the code word transmitted and it is then sufficient to extract the information sub-matrix to recover the information bits.

The FIG. 5 diagram illustrates the operation of the decoder for 4 iterations.

The method of the invention applies to all types of linear block code, such as BCH codes, including Reed-Solomon, Reed-Muller, QR, cyclic, etc. codes, without using algebraic decoders and complex calculations in Gallois finite bodies.

FIGS. 6 and 7 show the results of decoding in accordance with the invention. FIG. 6 shows the results of decoding the extended BCH(31,21) product code using the method described with reference to FIG. 4 and FIG. 1. The bit error rate is plotted on the vertical axis in the figure and the signal to noise ratio Eb/N0 in dB is plotted on the horizontal axis. The figure shows the results obtained for the ½ convolutional code with a constraint length of 7 and the results obtained after 1, 2, 3 and 4 iterations of the decoding process of the invention.

For the FIG. 6 simulation, J=50 code words were calculated (step 5 in FIG. 1), of which the Q=19 best words were retained each time. The table below sets out the coefficients ($a_i$) used for the rows and the columns:

| $a_1$ | $a_2$ | $a_3$ | $a_4$ | $a_5$ | $a_6$ | $a_7$ | $a_8$ |
|---|---|---|---|---|---|---|---|
| 0.0 | 0.3 | 0.5 | 0.7 | 0.9 | 1 | 1 | 1 |

The coefficients ($b_i$) below were used where no concurrent code words were found:

| $b_1$ | $b_2$ | $b_3$ | $b_4$ | $b_5$ | $b_6$ | $b_7$ | $b_8$ |
|-------|-------|-------|-------|-------|-------|-------|-------|
| 0.2 | 0.3 | 0.6 | 0.8 | 1 | 1 | 1 | 1 |

The figure shows a coding gain close to 2 dB relative to the ½ code, for a bit error rate as low as $10^{-6}$.

FIG. 7 shows corresponding results for a BCH(30,19)× BCH(30,24) product code. The BCH(30,19) code is a code shortened by 2 derived from the extended BCH(31,21) code. The BCH(30,24) code is a code shortened by 2 derived from the extended BCH(31,26) code. The coding gain is better than 2 dB compared to the same reference code.

In all embodiments of the invention, iterative decoding of product codes in accordance with the invention provides improved performance with the same number of iterations as the algorithm proposed in FR-A-2 712 760.

Of course, the present invention is not limited to the examples and embodiments described and shown, and is open to numerous variations that will be evident to the skilled person. Thus the invention has been described with reference to a $C_1.C_2$ product code but applies to codes of different forms, for example product codes of three block codes or more, and to product codes of the type described in the above-mentioned patent application 97 12594 in the name of the applicant. These product codes are specifically applied to the coding of packets in asynchronous transfer mode (ATM) transmission: a code $C_1$ is used to code the headers which is different from the code $C_2$ used for the body of the packet. A code $C_3$ is then applied to the columns of the matrix whose rows are formed of words of codes $C_1$ and $C_2$.

Similarly, the methods of FIGS. 1 to 3 can be used for iterative decoding algorithms other than the one shown in FIG. 4.

It is also clear that the formulation of the received product code word in terms of "rows" and "columns" is used here only for convenience, and that the values received on the channel are not in the form of a matrix. It is immaterial whether decoding starts with "rows" or "columns". The expression "words of a product code received at the output of a transmission channel" must therefore be understood as referring to successive values, or to a sequence of binary values accompanied by noise, received at the output of a transmission channel.

Furthermore, the invention has been described with reference to systematic block codes. The methods of the first and third embodiments apply to C(n, k, d) codes which are not in a systematic form, in that they can be easily converted into codes in a systematic form, in the form of a product by a matrix of rank $\underline{k}$. The invention has been described with reference to the example of binary codes, but applies also to q-ary codes with $q \neq 2$.

What is claimed is:

1. A method of soft input to soft output decoding of a word ($\underline{s}$) of a block linear code of dimension $\underline{k}$ and length $\underline{n}$, received from a transmission channel, comprising the steps of:
   generating a list of firm words ($\underline{u}_b$) of the code close to the received code word ($\underline{s}$) by coding a list of the most likely seeming k-tuplets, and
   calculating the $j^{th}$ component of the output soft word as the difference between the metrics of the closest generated code word and the closest generated code word having an opposite $j^{th}$ component.

2. A method according to claim 1, characterized in that the most likely k-tuplets are obtained by firm approximation of the components of the received word and by changing the least reliable components.

3. A method according to claim 1, wherein each k-tuplet from the list of k-tuplets is obtained by:
   listing the components of the received code word in order of reliability with a permutation (T),
   verifying that the $\underline{k}$ most reliable components of the word obtained in this way can generate the other n–k components,
   choosing firm values for the least reliable $\underline{m}$ components from said $\underline{k}$ components, where $\underline{m}$ is an integer less than $\underline{k}$,
   firmly approximating the other k–m components, and
   coding the firm word obtained in this way by a code equal to the composition of said code by the inverse of said permutation.

4. A method according to claim 3, wherein the verification is effected by:
   applying the code of the permutation to the columns of the parity matrix, and
   verifying the rank of the matrix formed of the last n–k columns of the permutated parity matrix.

5. A method according to claim 3, wherein the verification step, when negative, is followed by a step of modifying the permutation.

6. A method according to claim 1, wherein each k-tuplet from the list of klets is obtained by:
   listing the first $\underline{k}$ components of the received code word in order of reliability with a permutation (T),
   choosing firm values for the least reliable $\underline{m}$ components, where $\underline{m}$ is an integer less than $\underline{k}$,
   firmly approximating the other k–m components, and
   coding the firm word obtained in this way by a code equal to the composition of said code by the inverse of said permutation.

7. A method according to claim 1, characterized in that, if there is no closest generated code word having an opposite $j^{th}$ component, the $j^{th}$ component of the output soft word is calculated as the difference between the metric of the closest generated code word and the farthest generated code word.

8. A method according to claim 1, characterized in that, if there is no closest generated code word having an opposite $j^{th}$ component, the $j^{th}$ component of the output soft word is calculated by adding to the $j^{th}$ component of the received word a coefficient assigned the sign of the firm decision of the $j^{th}$ component of the closest code word received.

9. A method according to claim 1, characterized in that the received word is affected by additive Gaussian white noise.

10. A method of iterative decoding a word ($\underline{R}$) of a product code received from a transmission channel, comprising for at least one iteration soft input to soft output decoding of rows or columns of said product code word using the method according to claim 1.

11. A method of soft input to soft output decoding a word ($\underline{s}$) of a block linear code of dimension $\underline{k}$ and length $\underline{n}$ received from a transmission channel, comprising the steps of:
   choosing the code word closest the received word in a list of firm words ($\underline{u}_b$) of the code close to the received code word ($\underline{s}$) generated by coding a list of the least likely k-tuplets,
   for each $j^{th}$ component of the received word, $\underline{j}$ varying from 1 to $\underline{n}$:

replacing the $j^{th}$ component of the received word by the inverse of the $j^{th}$ component of said nearest code word, choosing the code word nearest the word obtained in the replacement step in a list of firm words of the code close to the code word obtained in the replacement step, generated by coding a list of the most likely k-tuplets, calculating the $j^{th}$ component of the output soft word as the difference between the metric of the code word nearest the received word and the code word nearest the word obtained in the replacement step.

12. A method according to claim 11, characterized in that in the step of choosing the code word closest to the received word the most likely k-tuplets are obtained by firmly approximating the most reliable components of the received word and changing the least reliable components.

13. A method according to claim 11 or claim 12, characterized in that in the step of choosing the code word closest to the word obtained in the replacement step the most likely k-tuplets are obtained by firmly approximating the most reliable components of the word obtained in the replacement step and changing the least reliable components.

14. A method according to claim 11, characterized in that the received word is affected by additive Gaussian white noise.

* * * * *